(12) United States Patent
Cai

(10) Patent No.: US 10,325,941 B2
(45) Date of Patent: Jun. 18, 2019

(54) FLEXIBLE SUBSTRATE AND FABRICATION METHOD THEREOF, AND DISPLAY PANEL

(71) Applicants: Shanghai Tianma Micro-Electronics Co., Ltd., Shanghai (CN); Tianma Micro-Electronics Co., Ltd., Shenzhen (CN)

(72) Inventor: Xiaobo Cai, Shanghai (CN)

(73) Assignees: Shanghai Tianma Micro-Electronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 15/467,454

(22) Filed: Mar. 23, 2017

(65) Prior Publication Data
US 2017/0194365 A1 Jul. 6, 2017

(30) Foreign Application Priority Data

Nov. 1, 2016 (CN) .......................... 2016 1 0934957

(51) Int. Cl.
H01L 27/12 (2006.01)
H01L 51/00 (2006.01)
H01L 51/56 (2006.01)
G02F 1/1333 (2006.01)
G02F 1/1335 (2006.01)

(52) U.S. Cl.
CPC ........ *H01L 27/1266* (2013.01); *H01L 51/003* (2013.01); *H01L 51/0097* (2013.01); *H01L 51/56* (2013.01); *G02F 1/133305* (2013.01); *G02F 1/133512* (2013.01); *G02F 1/133514* (2013.01); *G02F 2201/503* (2013.01); *G02F 2202/022* (2013.01); *H01L 2251/5338* (2013.01)

(58) Field of Classification Search
None
See application file for complete search history.

(56) References Cited

U.S. PATENT DOCUMENTS

2014/0065393 A1* 3/2014 Lee .................... H01L 21/6835
428/216
2014/0217383 A1* 8/2014 Park ....................... H01L 51/56
257/40
2015/0102324 A1* 4/2015 Lee ..................... H01L 27/3244
257/40

(Continued)

FOREIGN PATENT DOCUMENTS

CN 103985823 A 8/2014
CN 104103648 A 10/2014

(Continued)

Primary Examiner — Shaun M Campbell
(74) Attorney, Agent, or Firm — Anova Law Group, PLLC

(57) ABSTRACT

A flexible substrate, a display panel, and a fabrication method of the flexible substrate are provided. The fabrication method comprises providing a bearing substrate including a bearing surface and a back-surface opposite to the bearing surface, and forming a stress-absorbing layer on the back-surface of the bearing substrate. The fabrication method further comprises forming a flexible substrate material layer, a blocking layer, and a device layer sequentially on the bearing surface of the bearing substrate, and removing the bearing substrate and the stress-absorbing layer formed on the back-surface of the bearing substrate.

14 Claims, 7 Drawing Sheets

(56) References Cited

U.S. PATENT DOCUMENTS

2016/0226024 A1* 8/2016 Park ................... H01L 51/5256

FOREIGN PATENT DOCUMENTS

| CN | 104464524 A | 3/2015 |
| CN | 104538425 A | 4/2015 |
| CN | 104934371 A | 9/2015 |
| CN | 105845707 A | 8/2016 |

* cited by examiner

FLEXIBLE SUBSTRATE AND FABRICATION METHOD THEREOF, AND DISPLAY PANEL

CROSS-REFERENCES TO RELATED APPLICATIONS

This application claims priority of Chinese Patent Application No. 201610934957.2, filed on Nov. 1, 2016, the entire contents of which are hereby incorporated by reference.

FIELD OF THE DISCLOSURE

The present disclosure generally relates to the field of display technology and, more particularly, relates to a flexible substrate, a display panel, and a fabrication method of the flexible substrate.

BACKGROUND

With the continuous development of the display technology, flexible display panels are gradually applied to all kinds of electronic products.

In existing technologies, a flexible display panel is fabricated based on a flexible substrate. For example, for a liquid crystal display panel, the flexible substrate includes an array substrate and a color film substrate. For an organic light-emitting display panel, the flexible substrate includes an organic light-emitting substrate. More specifically, a fabrication process of the flexible substrate may include funning a flexible substrate material layer, a blocking layer, and a device layer sequentially on a rigid substrate. Further, the fabrication process includes separating the rigid substrate and the flexible substrate material layer. That is, the rigid substrate may be stripped off to obtain a flexible substrate.

Because the material of the rigid substrate, the material of the flexible substrate material layer, and the material of the blocking layer have different Young's modulus and thermal expansion coefficients, stresses generated during sequential formation of the flexible substrate material layer and the blocking layer on the rigid substrate are different. Accordingly, the flexible substrate material layer and the blocking layer may be easily bent and crack, thereby affecting subsequent device fabrication precision and device performance.

The disclosed flexible substrate and fabrication method thereof, and display panel are directed to solving at least partial problems set forth above and other problems.

BRIEF SUMMARY OF THE DISCLOSURE

One aspect of the present disclosure provides a fabrication method of a flexible substrate. The fabrication method comprises providing a bearing substrate including a bearing surface and a back-surface opposite to the bearing surface, and forming a stress-absorbing layer on the back-surface of the bearing substrate. The fabrication method further comprises forming a flexible substrate material layer, a blocking layer, and a device layer sequentially on the bearing surface of the bearing, substrate, and removing the bearing substrate and the stress-absorbing layer formed on the back-surface of the bearing, substrate.

Another aspect of the present disclosure provides a flexible substrate. The flexible substrate comprises a flexible substrate material layer, a blocking layer disposed on the flexible substrate material layer, and a device layer disposed on the blocking layer facing away the flexible substrate material layer. The flexible substrate material layer includes organic layers and inorganic layers arranged and stacked alternately, and organic layers are formed on two sides of the inorganic layer.

Another aspect of the present disclosure provides a display panel. The display panel comprises a flexible substrate. The flexible substrate comprises a flexible substrate material layer, a blocking layer disposed on the flexible substrate material layer, and a device layer disposed on the blocking layer facing away the flexible substrate material layer. The flexible substrate material layer includes organic layers and inorganic layers arranged and stacked alternately, and organic layers are formed on two sides of the inorganic layer.

Other aspects of the present disclosure can be understood by those skilled in the art in light of the description, the claims, and the drawings of the present disclosure.

BRIEF DESCRIPTION OF THE DRAWINGS

Other features, goals, and advantages of the present disclosure will become more apparent via a reading of detailed descriptions of non-limiting embodiments with reference to the accompanying drawings.

DETAILED DESCRIPTION

The present disclosure is further illustrated in, detail with reference to the accompanying drawings and embodiments.

It should be understood that, specific embodiments described herein are only used to illustrate the present disclosure, but are not intended to limit the present disclosure. In addition, it should be further illustrated that, for ease of description, accompanying drawings only illustrate a part of but not entire content related to the present disclosure.

As discussed above, stresses generated during, sequential formation of the flexible substrate material layer and the blocking layer on the rigid substrate are different. Accordingly, the flexible substrate material layer and the blocking layer may be easily bent and crack, thereby affecting subsequent device fabrication precision and device performance.

Directed to solving at least partial problems set forth above and other problems, the present disclosure provides an improved fabrication method of a flexible substrate. According to the present disclosure, the fabrication method includes forming a stress-absorbing layer on the back-surface of a bearing substrate (e.g., a rigid substrate), and forming a flexible substrate material layer, a blocking layer, and a device layer on the bearing surface of the bearing substrate. Further, the fabrication method includes removing the bearing substrate and the stress-absorbing layer formed on the back-surface of the bearing substrate to obtain a flexible substrate.

By using such a fabrication method, the stress at an interface between the stress-absorbing layer and the bearing substrate may partially balance the stress at an interface between the flexible substrate material layer and the bearing substrate. Further, the bending and cracking of the flexible substrate material layer and the blocking layer may be reduced, and the device fabrication precision and device performance may be improved.

By forming the stress-absorbing layer on the back-surface of a bearing substrate, the stress at an interface between the stress-absorbing layer and the bearing substrate may partially balance the stress at an interface between the flexible substrate material layer and the bearing substrate. Accordingly, the device fabrication precision and device performance may, be improved.

Figure 1:
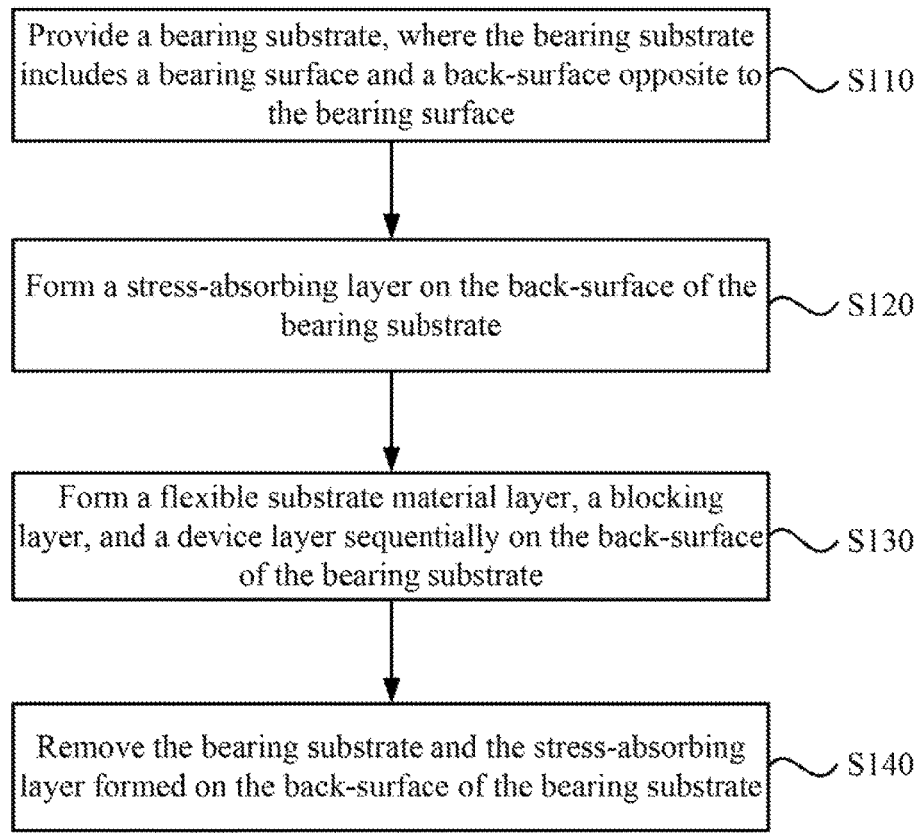
FIG. 1 illustrates a flow chart of an exemplary fabrication method of a flexible substrate according to embodiments of the present disclosure.
Figure 2:
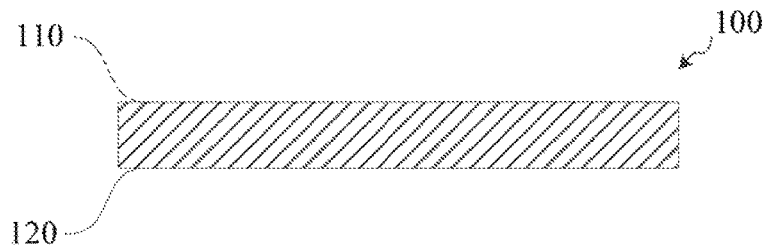
FIG. 2 illustrates a cross-sectional view of an exemplary bearing substrate according to embodiments of the present disclosure.
Figure 3:
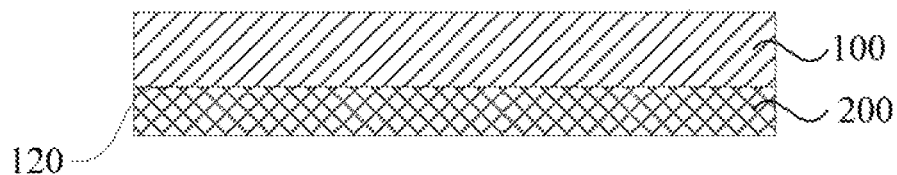
FIG. 3 illustrates a cross-sectional view of a stress-absorbing layer formed on a back-surface of a bearing substrate according to embodiments of the present disclosure.

FIG. 1 illustrates a flow chart of an exemplary fabrication method of a flexible substrate according to embodiments of the present disclosure. FIG. 2 illustrates a cross-sectional view of an exemplary bearing substrate according to embodiments of the present disclosure. FIG. 3 illustrates a cross-sectional view of a stress-absorbing layer formed on a back-surface of a bearing substrate according to embodiments of the present disclosure. As shown in FIG. 1, the fabrication method of the flexible substrate may specifically include the following steps (S110~S140).

Step 110: providing a bearing substrate, where the bearing substrate includes a bearing surface and a back-surface opposite to the bearing surface.

More specifically, referring to FIG. 2, a bearing substrate 100 may include two opposite surfaces, where one surface is used as, a bearing surface 110, and the other surface is used as a back-surface 120. The bearing substrate 100 may be a rigid substrate, such as a glass substrate. As a rigid substrate, the bearing substrate 100 may have a support function.

Step 120: forming a stress-absorbing layer on the back-surface of the bearing substrate.

Specifically, referring to FIG. 3, a stress-absorbing layer 200 may be formed on the back-surface 120 of the bearing substrate 100. In one embodiment, the stress-absorbing layer 200 may be made of an organic material. Because materials forming the bearing substrate 100 and the stress-absorbing layer 200 have different Young's modulus and thermal expansion coefficients, a certain amount of interface stress may exist at the interface between the stress-absorbing layer 200 and the bearing substrate 100.

Step 130: forming a flexible substrate material layer, a blocking layer, and a device layer sequentially on the bearing surface of the bearing substrate.

For example, the flexible substrate material layer may include organic layers and inorganic layers arranged and stacked alternately, and each inorganic layer is sandwiched by two organic layers. Optionally, the organic layers of the flexible substrate material layer may be made of an organic material the same as the stress-absorbing layer 200.

Further, the organic layers configured in the flexible substrate material layer may have a function to prevent extension or propagation of cracks. Further, because brittleness of the inorganic layer may be relatively high, a too thick inorganic layer may be easily cracked. By alternately disposing the organic layers and the inorganic layer, the present disclosure may solve aforementioned issues.

Correspondingly, forming the flexible substrate material layer on the bearing surface of the bearing substrate may further include: forming a plurality of grooves in each inorganic layer of at least one of the inorganic layers, and forming an organic layer on one side of the each inorganic layer facing away the bearing substrate, where the organic layer extends into or fill the plurality of grooves. Accordingly, the organic layers on two sides of the inorganic layer may be combined integrally.

The present disclosure is not intended to specifically limit the number of the organic layers and the number of the inorganic layers included in the flexible substrate. Further, the present disclosure is not, intended to limit the number of layers and positions of the inorganic layers including grooves. For ease of illustration, the fabrication process of the flexible substrate material layer is described in detail using a flexible substrate material layer including three organic layers and two inorganic layers as an example, where the two inorganic layers each include a plurality of grooves.

Specifically, FIG. 4-FIG. 10 illustrate cross-sectional schematic views of organic layers and inorganic layers arranged alternately in a flexible substrate material layer disposed on a bearing surface of a bearing substrate according to embodiments of the present disclosure.

Figure 4:
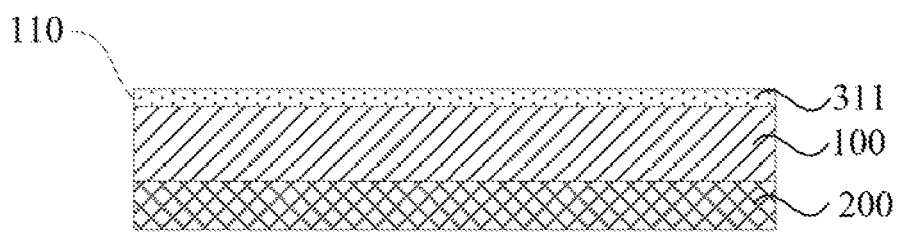
FIG. 4-FIG. 10 illustrate cross-sectional schematic views of organic layers and inorganic layers arranged alternately in a flexible substrate material layer disposed on a bearing surface of a bearing substrate according to embodiments of the present disclosure.
Figure 5:
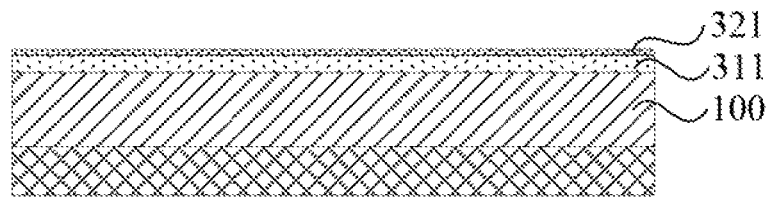
Figure 6:
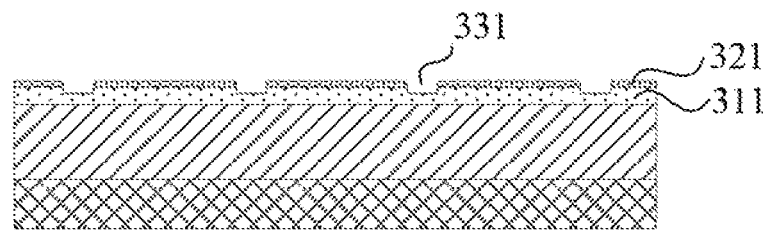

Referring to FIG. 4, a first organic layer 311 may be formed on the bearing surface 110 of the bearing substrate 100. Referring to FIG. 5, a first inorganic layer 321 may be formed on one side of the first organic layer 311 facing away the bearing substrate 100. In one embodiment, the first inorganic layer 321 may be deposited via a plasma enhanced chemical vapor deposition (PECVD) process. Referring to FIG. 6, a plurality of first grooves 331 may be formed on one side of the first inorganic layer 321 facing away the first organic layer 311.

Optionally, the plurality of first grooves 331 may penetrate through the first inorganic layer 321 and partially penetrate the first organic layer 311. For example, the penetration depth of the first grooves 331 in the first organic layer 311 may be approximately 0.2~0.5 µm. Further, in one embodiment, a wet etching or photo-etching method may be applied to form the plurality of first grooves 331.

Figure 15:
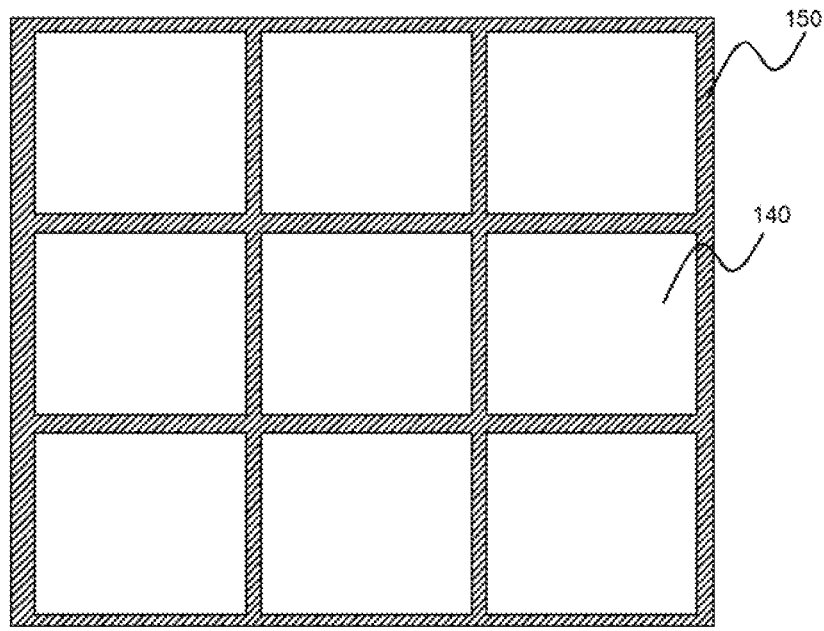
FIG. 15 illustrates a schematic view of relative positions of a display region and a non-display region of an exemplary display panel according to embodiments of the preset disclosure.

Further, to prevent the first grooves 331 affecting normal display of a display panel, the plurality of first grooves 331 may be disposed in the non-display region and/or the display region of the display panel covered by black matrices. FIG. 15 illustrates a schematic view of relative positions of a display region and a non-display region of an exemplary display panel according to embodiments of the present disclosure. In one embodiment, as shown in FIG. 15, the display panel may include a display region 140 and a non-display region 150, and the plurality of the first grooves 331 may be disposed in the non-display region 150.

Figure 7:
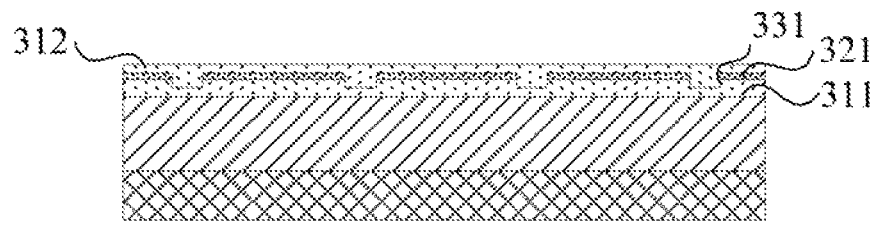
Figure 8:
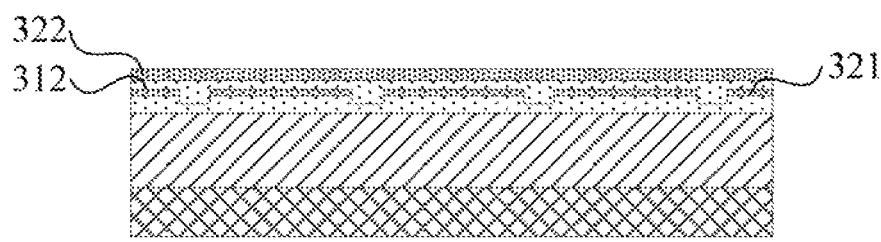
Figure 9:
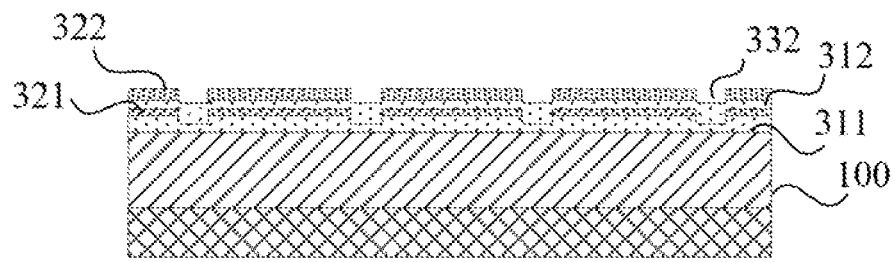

Referring to FIG. 7, a second organic layer 312 may be formed on one side of the first inorganic layer 321 facing away the first organic layer 311, and the second organic layer 312 may fill the plurality of first grooves 331. Referring to FIG. 8, a second inorganic layer 322 may be formed on one side of the second organic layer 312 facing away the first inorganic layer 321. Referring to FIG. 9, a plurality of second grooves 332 may be formed on one side of the second inorganic layer 322 facing away the second organic layer 312. Optionally, the plurality of second grooves 332 may penetrate the second inorganic layer 322 and partially penetrate or not penetrate the second organic layer 312.

Optionally, a fabrication process of the plurality of second grooves 332 may be the same as the fabrication process of the plurality of first grooves 331. Along a direction from the bearing, substrate 100 to the first organic layer 311, the second grooves 332 illustrated in FIG. 9 may be entirely overlapped with the first grooves 331, or partially overlapped with the first grooves 331. Optionally, under conditions that the second grooves 332 and the first grooves 331 are all disposed in the non-display region and/or display region of the display panel covered by the black matrices, the second grooves 132 and the first grooves 331 may have no overlapping region.

Figure 10:
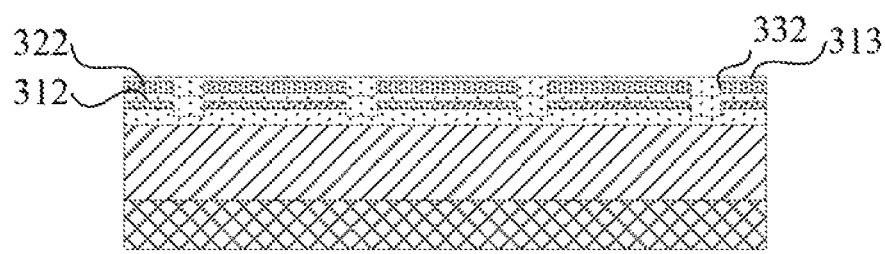

Further, referring to FIG. 10, a third organic layer 313 may be formed on one side of the second inorganic layer 322 facing away the second organic layer 312, and the third organic layer 313 may fill and cover the plurality of second grooves 332.

Optionally, in aforementioned embodiments, all inorganic layers in the flexible substrate material layer may each include a plurality of grooves. Optionally, a part of the inorganic layers in the flexible substrate material layer may each include a plurality of grooves, and the rest part of the inorganic layers in the flexible substrate material layer may not include a plurality of grooves.

Further, referring to FIG. 6 to FIG. 10, the depth of the grooves may be greater than or equal to the thickness of the corresponding inorganic layer, and thinner than or equal to the sum of thicknesses of the organic layer disposed on one side of the inorganic layer facing towards the bearing substrate and the corresponding inorganic layer. Such a configuration may, on one hand, allow two adjacent organic layers to be contacted and bonded. Because the two adjacent organic layers are both made of an organic material, the bonding strength between the two adjacent organic layers may be greater than the bonding strength between an organic layer and an inorganic layer. Accordingly, the bonding strength between each layer in the flexible substrate material layer may be enhanced.

Figure 17:
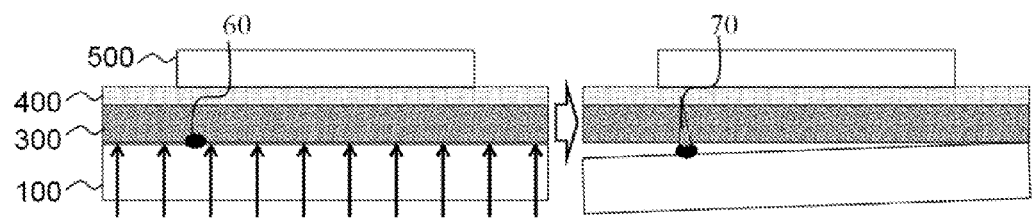
FIG. 17 illustrates a schematic view of an exemplary stress concentration phenomenon according to embodiments of the present disclosure.

On the other hand, while separating the bearing substrate and the flexible substrate material layer in a subsequent process (e.g., laser irradiation, mechanical stripping, or a combination thereof), a phenomenon of stress concentration may occur due to the existence of foreign particles, thus leading to the occurrence of cracks. FIG. 17 illustrates a schematic view of an exemplary stress concentration phenomenon according to embodiments of the present disclosure.

As shown in FIG. 17, a flexible substrate material layer 300 may be funned on a bearing substrate 100, and a blocking layer 400 may be formed on one side of the flexible substrate material layer 300 facing away the bearing substrate 100. Further, a device layer 500 may be formed on one side of the blocking layer 400 facing away the flexible substrate material layer 300. The flexible substrate material layer 300 may, for example, further include a first organic layer (not shown), and a first inorganic layer (not shown) disposed on the first organic layer, etc.

Further, a crack 70 may extend outwards from a cracking source 60 (i.e., a position where the foreign particles exist) between the first organic layer of the flexible substrate material layer 300 and the bearing substrate 100. Because the endurance of the first organic layer may be relatively poor, the crack 70 may easily propagate into the first organic layer included in the flexible substrate material layer 300. Without the first inorganic layer disposed on the first organic layer, the crack 70 may further extend into the blocking layer 400 or the device layer 500. By disposing the first inorganic layer with a relatively high the rigidity, the in present disclosure may prevent continuous extension or propagation of the cracks. That is, the first inorganic layer may provide a protection function under such situations.

Figure 18:
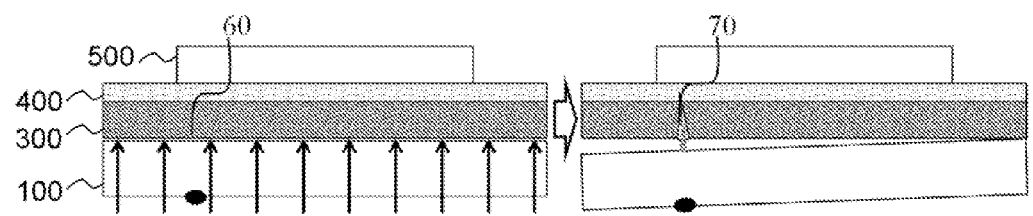
FIG. 18 illustrates a schematic view of another exemplary stress concentration phenomenon according to embodiments of the present disclosure.

FIG. 18 illustrates a schematic view of another exemplary stress concentration phenomenon according to embodiments of the present disclosure. As shown in FIG. 18, a crack source may be optionally located at the back-surface of the bearing substrate 100, and when separating the bearing substrate 100 from the flexible substrate material layer 300, a crack 70 may extend outwards from a corresponding position due to the phenomenon of stress concentration. Other same or similar structures shown in FIG. 18 may refer to embodiments described in FIG. 17, and are not repeatedly illustrated herein.

Further, in one embodiment, a value range of the width of the groove may be approximately 50-100 μm. A too wide groove may affect the blocking effect of the groove towards the cracks, and a too narrow groove may reduce the bonding strength between two adjacent organic layers.

Figure 11:
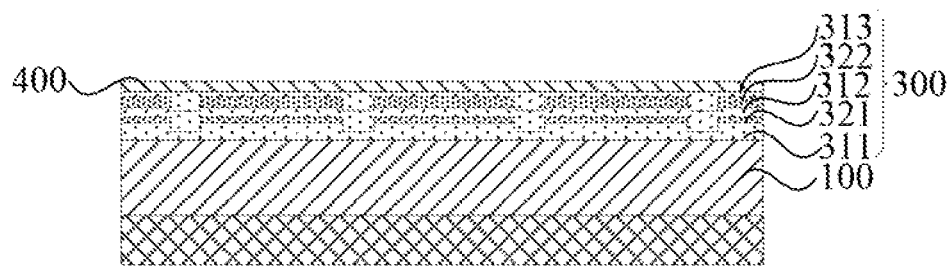
FIG. 11 illustrates a cross-sectional view of a blocking layer disposed on a flexible substrate material layer according to embodiments of the present disclosure.

FIG. 11 illustrates a cross-sectional view of a blocking layer disposed on a flexible substrate material layer according to embodiments of the present disclosure. As shown in FIG. 11, the flexible substrate material layer 300 may include the first organic layer 311, the first inorganic layer 321, the second organic layer 312, the second inorganic layer 322, and the third organic layer 313. Further, a blocking layer 400 may be formed on one side of the flexible substrate material layer 300 facing away the bearing substrate 100.

Optionally, the blocking layer 400 may be made of an inorganic material. For example, the blocking layer 400 may be a stacking structure made of $SiO_2$ layers and $SiN_x$ layers. In a flexible display panel, the blocking layer disposed between the flexible substrate and a display functional layer may have a protection function towards a subsequently formed device layer, and simultaneously, protect the flexible substrate from being damaged in a device fabrication process.

Figure 12:
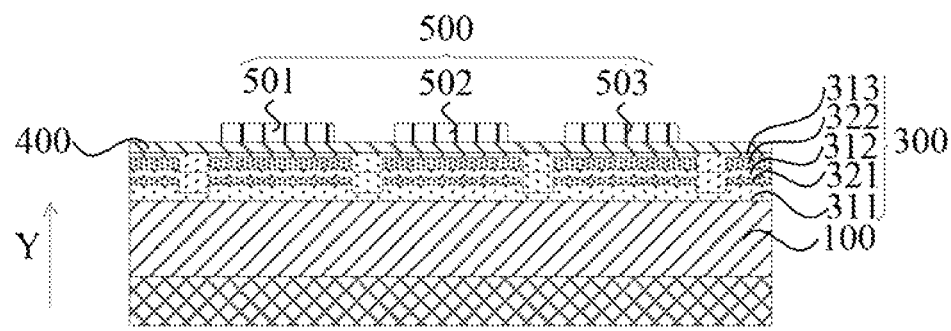
FIG. 12 illustrates a cross-sectional view of a device layer disposed on a blocking layer according to embodiments of the present disclosure.

FIG. 12 illustrates a cross-sectional view of a device layer disposed on a blocking layer according to embodiments of the present disclosure. As shown in FIG. 12, a device layer 500 may be formed on one side of the blocking layer 400 facing away the flexible substrate material layer 300. Other structures similar to or the sane as that illustrated in FIG. 11 may refer to aforementioned descriptions, and are not repeated herein.

In one embodiment, the device layer 500 may include a plurality of light-emitting units. Along a direction (i.e., a Y direction) from the bearing substrate 100 to the blocking layer 500, the grooves may not overlap with the plurality of light-emitting units. For example, the device layer may include a plurality of color filter units, and along the Y direction from the bearing substrate 100 to the blocking layer 500, the grooves may not overlap with the plurality of color filter units.

For example, as shown in FIG. 12, the device layer 500 may include a first portion 501, a second portion 502, and a third portion 503. Along the direction Y from the bearing substrate 100 to the blocking layer 400, the first portion 501, the second portion 502, and the third portion 503 may not overlap with the plurality of grooves in each inorganic layer of the flexible substrate material layer 300. Optionally, the first portion 501, the second portion 502, and the third portion 503 may each be a light-emitting unit, or a light-emitting unit group including a plurality of light-emitting units. In particular, the light-emitting unit may be an organic light-emitting unit, or a light-emitting unit disposed on an array substrate corresponding to a pixel unit.

Optionally, the first portion 501, the second portion 502, and the third portion 503 may each be a color filter unit, or a color filter unit group including a plurality of color filter units. In particular, the color filter unit may be a color filter unit disposed on a color film substrate of a liquid crystal display panel corresponding to the pixel unit, and different color filter units may be spaced apart by using a black matrix.

Further, the structure of the device layer 500 illustrated in FIG. 12 is only an example to illustrate a configuration situation between the device layer 500 and the plurality of grooves in each inorganic layer of the flexible substrate material layer 300. The present disclosure is not intended to limit the structure of the device layer 500. Along the direction Y from the hearing substrate 100 to the blocking layer 400, various variation structures obtained assuming that the plurality of grooves in each inorganic layer of the flexible substrate material layer 300 does not overlap with the light-emitting unit or color filter unit in the device layer 500 shall all fall within the protection scope of the present disclosure.

Further, a fabrication method of the disclosed flexible substrate may be applicable to an organic light-emitting display panel or a liquid crystal display panel. For an organic light-emitting display panel, the flexible substrate may be an organic light-emitting substrate, and the device layer may include a plurality of organic light-emitting units. For a liquid display panel, the flexible substrate may be an array substrate or a color film substrate.

Further, when the flexible substrate is an array substrate, the device layer may include a plurality of light-emitting units corresponding to a plurality of pixel units. When the flexible substrate is a color film substrate, the device layer may include a plurality of color filter units corresponding to the plurality of pixel units in the array substrate. To avoid the grooves having a negative effect on the display effect of the display panel, according to the present disclosure, along the direction from the bearing substrate to the blocking layer, the grooves may not overlap with the plurality of light-emitting units or the plurality of color filter units.

For example, each organic layer in the flexible substrate material layer may be made of the same material, and baking temperatures at which the organic layers are solidified may be the same. For example, a material forming each organic layer of the flexible substrate may be polyimide, and the baking temperature may be between approximately 200° C. and 300° C. Such a configuration may enable the major processing parameters of each organic layer in the flexible substrate material layer differ only in thickness, such that the stress of each organic layer may be adjusted by properly adjusting the thickness of each organic layer. Accordingly, the interface stress at adjacent interfaces may tend to be balanced, and the bending degree of each organic layer and each inorganic layer may be reduced.

Those skilled in the art should understand that, in some other embodiments, different organic layers in the flexible substrate material layer may be made of the same material, or may be made of different materials. Further, the baking temperatures for solidification may be the same, or may be different. Specifically, based on needs of actual production process and comprehensive consideration of factors such as thickness, baking temperature, and material properties of each material layer in the flexible substrate, the interface stress at two interfaces adjacent to the flexible substrate material layer may be, adjusted to approach a balance. The present disclosure is not limited thereto, as long as the flexible substrate formed on the rigid substrate undergoes no bending deformation after thermal processing.

Optionally, the stress-absorbing layer formed on the back-surface of the bearing substrate may be made of a material the same as a material of each organic layer in the flexible substrate material layer. More specifically, the stress-absorbing layer formed on the back-surface of the bearing substrate and each organic layer in the flexible substrate material layer may be made of a polyimide material. Such a configuration may allow major processing parameters of each organic layer in the flexible substrate material layer and the stress-absorbing layer to differ only in thickness, such that the stress of the stress-absorbing layer and the stress of each organic layer in the flexible substrate material layer may be adjusted by properly configuring the corresponding thickness.

Accordingly, the interface stresses at two interfaces including one between the bearing substrate and the stress-absorbing layer and one between the bearing substrate and the flexible substrate material layer tend to be balanced. For example, to realize the balance of stress at the interfaces corresponding to the bearing surface of the bearing substrate and the back-surface of the bearing substrate, the thickness of the stress-absorbing layer may be configured to be slightly smaller than or equal to the total thickness of organic layers in the flexible substrate material layer.

Optionally, the baking temperature of the stress-absorbing layer formed on the back-surface of the bearing substrate may be greater than or equal to the baking temperature of each organic layer in the flexible substrate material layer. Specifically, the stress-absorbing; layer may often be formed before each organic layer in the flexible substrate material layer is formed. The baking temperature for fabricating the stress-absorbing layer is often considered as a standard temperature of the material. Further, a backing temperature higher than the standard temperature may result in damage of the organic layer.

Accordingly, when the stress-absorbing layer and each organic layer in the flexible substrate material layer are formed using the same material, the baking temperature of the stress-absorbing layer may be configured to be greater than or equal to the baking temperature of each organic layer in the flexible substrate material layer. Thus, damages towards each organic layer in the flexible substrate material layer may be avoided, and the flexible substrate on the rigid substrate may not be bent after the thermal processing.

Optionally, in other embodiments, the stress-absorbing layer and each organic layer in the flexible substrate material layer may be made of different materials. Accordingly, the thickness of the stress-absorbing layer and the total thickness of organic layers in the flexible substrate material layer may be configured to be different because of the difference in the thermal expansion coefficient, such that the flexible substrate formed on the rigid substrate may not be bent during or after the thermal processing.

Further, the thickness of the stress-absorbing layer formed on the back-surface of the bearing substrate may be smaller than or equal to the total thickness of organic layers in the flexible substrate material layer.

Further, the stress of an organic material may increase as the baking temperature increases. In one embodiment, when the baking temperature of the stress-absorbing layer is greater than or equal to the baking temperature of each organic layer in the flexible substrate material layer, the thickness of the stress-absorbing layer may be configured to be smaller than or equal to the total thickness of organic layers in the flexible substrate material layer. Thus, the balance of stress at the interfaces corresponding to the bearing surface and the back-surface of the bearing substrate may be achieved.

More specifically, a range of the thickness of the stress-absorbing layer disposed on the back-surface of the bearing substrate may be approximately 10 μm-20 μm. The total thickness of organic layers in the flexible substrate material layer may have a range of approximately 10 μm-25 μm.

Further, in one embodiment, the flexible substrate material layer may only include one organic layer, and optionally, the stress-absorbing layer and the flexible substrate material layer may be made of the same material.

Further, referring to FIG. 1, the fabrication method of the flexible substrate may further include the followings.

Step 140: removing the bearing substrate and the stress-absorbing layer formed on the back-surface of the bearing substrate.

Figure 16:
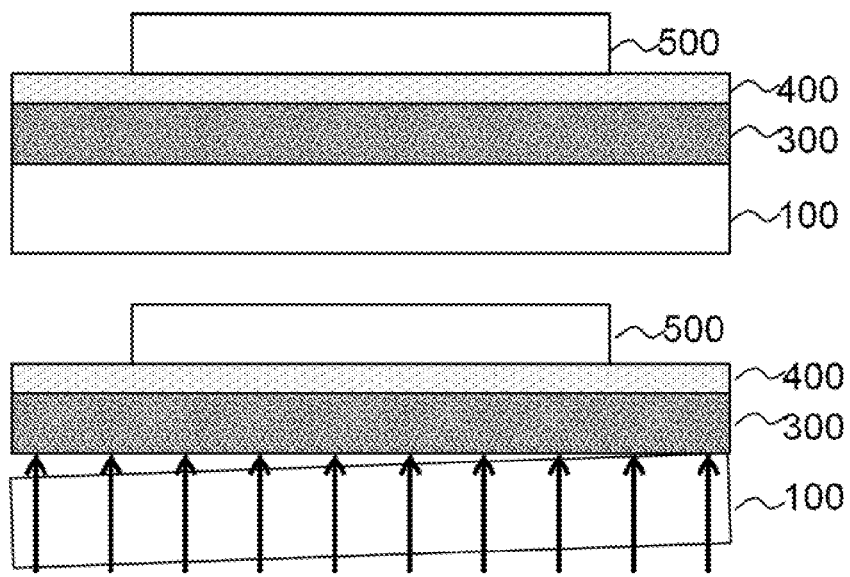
FIG. 16 illustrates a schematic view of a situation where a bearing substrate and a flexible material layer are separated according to embodiments of the present disclosure.

FIG. 16 illustrates a schematic view of a situation where a bearing substrate and a flexible material layer are separated according to embodiments of the present disclosure. As shown in FIG. 16, the flexible substrate material layer 300 may be formed on the bearing substrate 100, and the blocking layer 400 may be formed on one side of the flexible substrate material layer 300 facing away the bearing substrate 100. Further, the device layer 500 may be formed on one side of the blocking layer 400 facing away the flexible substrate material layer 300.

More specifically, the bearing substrate 100 and the flexible substrate material layer 300 may be separated. That is, the bearing substrate 100 may be stripped from the flexible substrate 300 via a removal operation. In one embodiment, because a stress-absorbing layer may be formed on the back-surface of the bearing substrate, when the bearing substrate 100 is stripped from the flexible substrate 300, the bearing substrate 100 and the stress-absorbing layer may be removed simultaneously. The removal operation may include, for example, a process of laser irradiation, mechanical stripping, or a combination thereof.

According to the present disclosure, a stress-absorbing layer may be formed on the back-surface of the bearing substrate, and a flexible substrate material layer, a blocking layer, and a device layer may be sequentially formed on the bearing surface of the bearing substrate. Further, the bearing substrate and the stress-absorbing layer on the back-surface of the bearing substrate may be removed to form a flexible substrate. Such a configuration/process may allow the stress at an interface between the stress-absorbing layer and the bearing substrate to partially balance the stress at an interface between the flexible substrate material layer and the bearing substrate.

Further, when the flexible substrate material, layer includes organic layers and inorganic layers arranged and stacked alternately, a force applied by inorganic layers in the flexible substrate material layer on the organic layer in contact with the blocking layer may partially balance a force applied by the blocking layer and the inorganic layers in the device layer on the organic layer in contact with the blocking layer.

Accordingly, different from situations where no stress-absorbing layer is configured and the flexible substrate material layer has a structure including alternately arranged organic layers and inorganic layers, the bending degree of a neutral surface in the flexible substrate may be reduced. Thus, the bending and cracking of the flexible substrate material layer and, the blocking layer may be inhibited, and the device fabrication precision and device performance may be improved.

Figure 13:
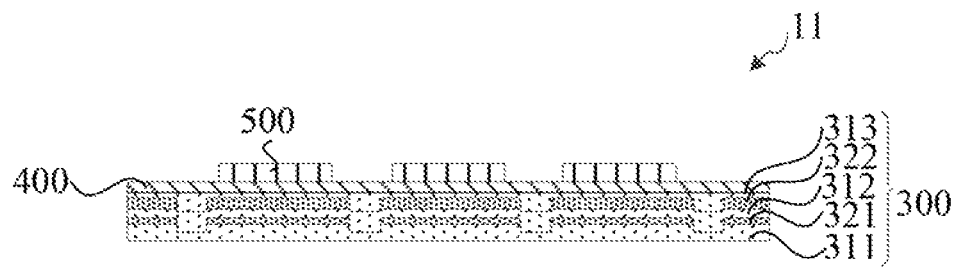
FIG. 13 illustrates a structural schematic view of an exemplary flexible substrate according to embodiments of the present disclosure.

Further, referring to FIG. 13, the present disclosure also provides a flexible substrate 11 including a flexible substrate material layer 300, a blocking layer 400 disposed on the flexible substrate material layer 300, and a device layer 500 disposed on the blocking layer 400 facing away the flexible, substrate material layer 300.

In particular, the flexible substrate material layer 300 may include organic layers and inorganic layer arranged and stacked alternately, and organic layers are formed on two sides of the inorganic layer. For example, the flexible substrate material layer 300 may include a first organic layer 311, a first inorganic layer 321, a second organic layer 312, a second inorganic layer 322, and a third organic layer 313.

Further, in some implementation methods, the flexible substrate 11 may be a flexible substrate fabricated using a method described in any aforementioned embodiment. Further, the inorganic layers in the flexible substrate material layer 300 may have a patterned structure formed by etching grooves and/or grooves. Accordingly, the organic layers on two sides of the inorganic layer may be combined integrally, and the bonding strength between the two organic layers may be greater than the bonding strength between an organic layer and an inorganic layer. Thus, the bonding strength between each layer in the flexible substrate material layer may be enhanced.

Optionally, each organic layer in the flexible substrate material layer 300 may be made of the same material, and the baking temperatures for solidification may be the same. Accordingly, when fabricating each, organic layer in the flexible substrate material layer 300, no material needs to be changed, thereby simplifying the processing process. Further, the use of the same material may allow a positive proportional relationship to exist between the stress and thickness of each organic layer. Thus, the thickness of each organic layer may be changed to realize adjustment of stress relationship of each organic layer.

Correspondingly, along the direction from the flexible substrate material layer 300 to the blocking layer 400, the thickness of each organic layer in the flexible substrate material layer 300 may decrease sequentially. That is, the thickness of the third, organic layer 313 may be smaller than the second organic layer 312, and the thickness of the second organic layer 312 may be smaller than the thickness of the first organic layer 311.

Further, in a preparation process of the flexible substrate 11, an organic layer farther from the blocking layer 400 in the flexible substrate material layer 300 may have a greater contribution to the total superimposed stress at an interface between the flexible substrate material layer 300 and the bearing substrate. Accordingly, alone the direction from the flexible substrate material layer 300 to the blocking layer 400, the thickness of each organic layer in the flexible substrate material layer 300 may be configured to decrease sequentially.

Thus, under situations where the stress at the interface between the flexible substrate material layer 300 and the bearing substrate remains unchanged, the total thickness of organic layers in the flexible substrate material layer 300 may be reduced, thus facilitating a lighter and thinner design of the display panel. Further, when the total thickness of organic layers in the flexible substrate material layer 300 is not considered, the thickness of each organic layer may be the same, or thicknesses of partial organic layers decreases sequentially and the thicknesses of the rest organic layers may be the same.

Optionally, each inorganic layer in the flexible substrate material layer 300 may be made of the same material. Accordingly, when each inorganic layer in the flexible substrate material layer 300 is fabricated, the material no longer needs to be changed, thereby simplifying the processing process. Further, the use of the same material may allow a positive proportional relationship to exist between the stress and thickness of each inorganic layer. Thus, the thickness of each inorganic layer may be changed to realize adjustment of stress relationship of each inorganic layer.

Correspondingly, along the direction from the flexible substrate material layer 300 to the blocking layer 400, the thickness of each inorganic layer in the flexible substrate material layer 300 may decrease sequentially.

Further, in the flexible substrate material layer 300, the inorganic layer closer to the blocking layer 400 may have a greater contribution to the total superimposed stress at the interface between the flexible substrate material layer 300 and the blocking layer 400. Accordingly, along the direction from the flexible substrate material layer 300 to the blocking layer 400, the thickness of each inorganic layer in the flexible substrate material layer 300 may be configured to increase sequentially.

Thus, under situations where the stress at the interface between the flexible substrate material layer 300 and the blocking layer 400 remains unchanged, the total thickness of inorganic layers in the flexible substrate material layer 300 may be reduced, thus facilitating a lighter and thinner design of the display panel. Further, when the total thickness of inorganic layers in the flexible substrate material layer 300 is not considered, the thickness of each inorganic layer may be the same, or the thicknesses of partial inorganic layers may decrease sequentially and the thicknesses of the rest inorganic layers may be the same.

In one embodiment, the third organic layer 313 disposed adjacent to the blocking layer 400 may be a target organic layer, and the second inorganic layer 322 disposed adjacent to the target organic layer in the flexible substrate material layer 300 may be a main inorganic layer. One side of the target organic layer in contact with the blocking layer 400 may receive a stress applied by inorganic materials forming the blocking layer 400 and each inorganic film layer in the device layer 500. The other side of the target organic layer may receive a stress applied by inorganic materials from the main inorganic layer and other inorganic layers in the flexible substrate material layer 300.

Further, inorganic layers other than the main inorganic layer in the flexible substrate material layer 300 may have a relatively far distance towards the target organic layer, and inorganic layers farther than the target organic layer may have a smaller thickness and a smaller stress. Further, the device layer 500 and the target organic layer may be only spaced apart by the blocking layer 400 made of an inorganic layer, and the inorganic layer in the device layer may be relatively thick.

Accordingly, the farce applied by each inorganic film layer in the device layer 500 on the target organic layer may be greater than a force applied by other inorganic layers in the flexible substrate material layer 300 on the target organic layer. Thus, in one embodiment, to realize the stress balance at interfaces of two opposite sides of the target organic layer, the thickness of the disclosed main inorganic layer may be configured to be greater than the thickness of the blocking layer 400.

Optionally, the thickness of the blocking layer 400 may be related to the highest processing temperature of the flexible substrate. For example, the range of the thickness of the blocking layer 400 may be approximately 0.5-1.0 μm, and the range of the thickness of the main inorganic layer may be approximately 1.5-2.0 μm. For example, each inorganic layer in the flexible substrate material layer 300 and the blocking layer 400 may be made of the same material.

More specifically, each inorganic layer in the flexible substrate material layer 300 and the blocking layer 400 may be made of $SiO_2$ or $SiN_x$. In other embodiments, each inorganic layer may be made of a material according to the blocking layer 400. For example, the blocking layer 400 may include two sequentially formed film layers made of $SiN_x$ and $SiO_2$, respectivel.

Correspondingly, the inorganic layers in the flexible substrate material layer 300 may include the first inorganic layer 311 made of $SiO_2$, and the second inorganic layer 322 made of $SiN_x$. Further, the total thickness of inorganic layers in the flexible substrate material layer 300 may be greater than the thickness of the blocking layer 400, and the thickness of the inorganic layer formed later may not be smaller than the thickness of a previously formed inorganic layer. That is, the thickness of the second inorganic layer 322 may not be smaller than the thickness of the first inorganic layer 321.

Optionally, the total thickness of each inorganic layer in the flexible substrate material layer 300 may be greater than the thickness of the blocking layer 400, such that the stress at the interface between the flexible substrate material layer 300 and the blocking layer 400 may tend to be balanced.

Figure 14:
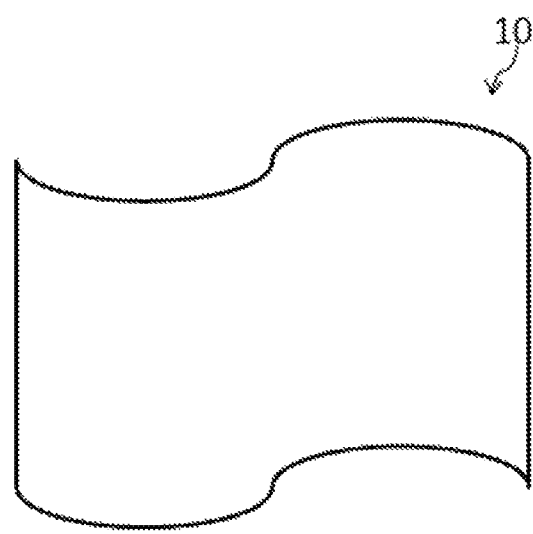
FIG. 14 illustrates a structural schematic view of an exemplary display panel according to embodiments of the present disclosure.

FIG. 14 illustrates a structural schematic view of an exemplary display panel according to embodiments of the present disclosure. As shown in FIG. 14, the display panel 10 may include a flexible substrate described in any aforementioned embodiment of the present disclosure. For example, the display panel 10 may be a liquid crystal display panel applicable to an electronic paper, or an organic light-emitting display panel. When the display panel 10 is a liquid crystal display panel, the flexible substrate included in the liquid crystal display panel may include an array substrate or a color film substrate. When the display panel 10 is an organic light-emitting display panel, the flexible substrate included in the organic light-emitting display panel may be an organic light-emitting substrate.

It should be noted that, the above detailed descriptions illustrate only preferred embodiments of the present disclosure and technologies and principles applied herein. Those skilled in the art can understand that the present disclosure is not limited to the specific embodiments described herein, and numerous significant alterations, modifications and alternatives may be devised by those skilled in the art without departing from the scope of the present disclosure.

Thus, although the present disclosure has been illustrated in above-described embodiments in details, the present disclosure is not limited to the above embodiments. Any equivalent or modification thereof, without departing from the spirit and principle of the present invention, falls within the true scope of the present invention, and the scope of the present disclosure is defined by the appended claims.

What is claimed is:

1. A fabrication method of a flexible substrate, comprising:
providing a bearing substrate including a bearing surface and a back-surface opposite to the bearing surface;
forming a stress-absorbing layer on the back-surface of the bearing substrate;
forming a flexible substrate material layer, a blocking layer, and a device layer sequentially on the bearing surface of the bearing substrate, wherein:
the flexible substrate material layer includes organic layers and inorganic layers arranged and stacked alternately,
organic layers are formed on two sides of an inorganic layer,
the inorganic layer is made of $SiO_2$ or $SiN_x$,
a plurality of grooves is formed in at least one of the inorganic layers, respectively, and
the device layer includes a plurality of light-emitting units or a plurality of color light-filtering units, and none of the plurality of grooves is overlapped with any of the plurality of light-emitting units or the plurality of color light-filtering units in the device layer along a direction from the bearing substrate to the blocking layer; and
removing the bearing substrate and the stress-absorbing layer formed on the back-surface of the bearing substrate,
wherein a baking temperature of the stress-absorbing layer formed on the back-side of the bearing substrate is greater than or equal to a baking temperature of each organic layer in the flexible substrate material layer.

2. The fabrication method according to claim 1, wherein: the stress-absorbing layer and the flexible substrate material layer are made of a same material.

3. The fabrication method according to claim 1, wherein forming the flexible substrate material layer on the bearing surface of the bearing substrate comprises:
forming an organic layer on one side of the at least one of the inorganic layers facing away from the bearing substrate, wherein the organic layer extends into the plurality of grooves.

4. The fabrication method according to claim 3, wherein: a depth of the plurality of grooves is greater than or equal to a thickness of the at least one of the inorganic layers, and smaller than or equal to a sum of thicknesses of the organic layer disposed on the one side of the at least one of the inorganic layers facing away from the bearing substrate and the at least one of the inorganic layers.

5. The fabrication method according to claim 3, wherein: a range of a width of a groove of the plurality of grooves is approximately 50-100 μm.

6. The fabrication method according to claim 1, wherein: along the direction from the bearing substrate to the blocking layer, none of the grooves are overlapped with any of the plurality of light-emitting units in the device layer.

7. The fabrication method according to claim 1, wherein: along the direction from the bearing substrate to the blocking layer, none of the grooves are overlapped with any of the plurality of color light-filtering units in the device layer.

8. The fabrication method according to claim 1, wherein: the organic layers in the flexible substrate material layer are made of a same material, and baking temperatures of the organic layers for solidification are the same.

9. The fabrication method according to claim 8, wherein: the stress-absorbing layer formed on the back-surface of the bearing substrate and the organic layers in the flexible substrate material layer are made of a same material.

10. The fabrication method according to claim 9, wherein: the stress-absorbing layer formed on the back-surface of the bearing substrate and the organic layers in the flexible substrate material layer are made of a polyimide material.

11. The fabrication method according to claim 1, wherein: a thickness of the stress-absorbing layer formed on the back-side of the bearing substrate is smaller than or equal to a total thickness of the organic layers in the flexible substrate material layer.

12. The fabrication method according to claim 11, wherein:
a range of the thickness of the stress-absorbing layer formed on the back-side of the bearing substrate is approximately 10 μm-20 μm, and
a range of the total thickness of the organic layers in the flexible substrate material layer is approximately 10 μm-25 μm.

13. A fabrication method of a flexible substrate, comprising:
providing a bearing substrate including a bearing surface and a back-surface opposite to the bearing surface;
forming a stress-absorbing layer on the back-surface of the bearing substrate;
forming a flexible substrate material layer, a blocking layer, and a device layer sequentially on the bearing surface of the bearing substrate, wherein the flexible substrate material layer includes organic layers and inorganic layers arranged and stacked alternately, and organic layers are formed on two sides of an inorganic layer; and
removing the bearing substrate and the stress-absorbing layer formed on the back-surface of the bearing substrate,
wherein forming the flexible substrate material layer on the bearing surface of the bearing substrate comprises:
forming a plurality of grooves in at least one of the inorganic layers, respectively, and
forming an organic layer on one side of the at least one of the inorganic layers facing away from the bearing substrate, wherein the formed organic layer extends into the corresponding plurality of grooves,
wherein the device layer includes a plurality of light-emitting units, and along a direction from the bearing substrate to the blocking layer, none of the grooves are overlapped with any light-emitting units in the device layer.

14. A fabrication method of a flexible substrate, comprising:
providing a bearing substrate including a bearing surface and a back-surface opposite to the bearing surface;
forming a stress-absorbing layer on the back-surface of the bearing substrate;

forming a flexible substrate material layer, a blocking layer, and a device layer sequentially on the bearing surface of the bearing substrate, wherein the flexible substrate material layer includes organic layers and inorganic layers arranged and stacked alternately, and organic layers are formed on two sides of an inorganic layer; and removing the bearing substrate and the stress-absorbing layer formed on the back-surface of the bearing substrate, wherein forming the flexible substrate material layer on the bearing surface of the bearing substrate comprises:

forming a plurality of grooves in at least one of the inorganic layers, respectively, and forming an organic layer on one side of the at least one of the inorganic layers facing away from the bearing substrate, wherein the formed organic layer extends into the corresponding plurality of grooves, wherein the device layer includes a plurality of color light-filtering units, and along a direction from the bearing substrate to the blocking layer, none of the grooves are overlapped with any color light-filtering units in the device layer.

* * * * *